United States Patent [19]
Okagawa et al.

[11] Patent Number: 5,635,733
[45] Date of Patent: Jun. 3, 1997

[54] SEMICONDUCTOR LIGHT EMITTING ELEMENT WITH A CURRENT DIFFUSING LAYER HAVING A CHANGING CARRIER CONCENTRATION THEREIN

[75] Inventors: Hiroaki Okagawa, Itami; Takayuki Hashimoto, Kuga-gun; Keiji Miyashita, Itami; Tomoo Yamada, Itami; Kazuyuki Tadatomo, Itami, all of Japan

[73] Assignee: Mitsubishi Cable Industries, Ltd., Hyogo, Japan

[21] Appl. No.: 601,279

[22] Filed: Feb. 16, 1996

[30] Foreign Application Priority Data

Feb. 20, 1995 [JP] Japan ..................... 7-030819

[51] Int. Cl.$^6$ ................................. H01L 33/00
[52] U.S. Cl. ..................... 257/94; 257/81; 257/99
[58] Field of Search ................. 372/44–48; 257/81, 257/94, 79, 99

[56] References Cited

U.S. PATENT DOCUMENTS

| | | | |
|---|---|---|---|
| 4,124,826 | 11/1978 | Dixon et al. | 372/45 |
| 5,444,269 | 8/1995 | Adomi et al. | 257/94 |
| 5,488,235 | 1/1996 | Nozaki et al. | 257/94 |
| 5,506,423 | 4/1996 | Saeki | 257/94 |
| 5,548,127 | 8/1996 | Shakuda | 257/94 |

Primary Examiner—Jerome Jackson
Assistant Examiner—Nathan K. Kelley
Attorney, Agent, or Firm—Sughrue, Mion, Zinn, Macpeak & Seas

[57] ABSTRACT

In the light emitting element comprising an n-type semiconductor substrate, a lower electrode formed on the lower surface of the substrate, and a light emitting part having a pn junction, which is composed of an InGaAlP compound semiconductor material, a p-type current diffusing layer and an upper electrode which are laminated on the upper surface of the substrate in that order from the substrate side, the improvement wherein a carrier concentration of the current diffusing layer is lower on a light emitting part side thereof than that on an upper electrode side thereof, and at least the upper electrode side of the current diffusing layer is composed of GaP. By employing such structure, diffusion of the dopant to a light emitting part can be suppressed even when the carrier concentration of the upper part of the current diffusing layer is set to be higher, thereby affording a lower resistance of the current diffusing layer as a whole. The GaP being a compound semiconductor without Al, the amount of the dopant necessary for affording the superior effects of suppressing the diffusion of the dopant to the light emitting part can be less. Consequently, the luminous efficiency can be improved as compared with conventional ones, and a light emitting element having a long service life and superior reliability can be obtained.

16 Claims, 3 Drawing Sheets

SEMICONDUCTOR LIGHT EMITTING ELEMENT WITH A CURRENT DIFFUSING LAYER HAVING A CHANGING CARRIER CONCENTRATION THEREIN

FIELD OF THE INVENTION

The present invention relates to a semiconductor light emitting element comprising an InGaAlP compound semiconductor as a material of the light emitting part.

The InGaAlP compound semiconductor material is defined by the formula: $In_y(Ga_{1-x}Al_x)_{1-y}P$ wherein $0 \leq x \leq 1$ and $0 \leq y \leq 1$ (hereinafter simply referred to as InGaAlP material).

BACKGROUND OF THE INVENTION

Of the semiconductor light emitting elements (hereinafter simply referred to as light emitting element), those comprising an InGaAlP material as the light emitting part emit light of from red to green.

There have been known light emitting elements comprising an n-type GaAs substrate, a light emitting part composed of an InGaAlP material, which is formed thereon, and a current diffusing layer formed on said light emitting part. FIG. 3 schematically shows one embodiment of the structure of such conventional light emitting element. In the example shown in this Figure, a light emitting part 2 formed of an InGaAlP material and a current diffusing layer 3A are sequentially formed on an n-type GaAs substrate 1, and electrodes 4 and 5 are formed in such a way that they sandwich the substrate, the light emitting part and the current diffusing layer in the laminating direction. In this Figure, the current diffusing layer 3A is hatched for emphasis. The light emitting part has a double heterojunction structure wherein an active layer 22 is interposed between an n-type cladding layer 21 and a p-type cladding layer 23, both having a greater band gap. In the following description, an electrode 4 on the substrate side is referred to as a lower electrode and an electrode 5 on the current diffusing layer side as an upper electrode. The current diffusing layer 3A functions to spread the current from the upper electrode to obtain light emission from a wide area of the active layer, and is formed from a material capable of transmitting the light from the light sitting part.

The current diffusing layer aims at spreading the current from the upper electrode toward the wider area of the light emitting part. Accordingly, the resistance of the semiconductor material to be used preferably has a lower resistance. A lower resistance of the semiconductor material can be achieved by setting the carrier concentration higher.

When the carrier concentration of the current diffusing layer is increased by adding a dopant at high concentrations, the dopant spreads to the light emitting part to reach the active layer, and acts as non-radiative recombination centers, which ultimately causes lower luminous efficiency.

In addition, the light emitting element wherein the dopant has spread to the light emitting part has an extremely short service life, thus raising a reliability problem in connection with the current diffusing layer.

SUMMARY OF THE INVENTION

It is therefore an object of the present invention to provide a light sitting element comprising an InGaAlP material for the light emitting part, which element having a higher luminous efficiency and a long service life. The object of the present invention can be accomplished by specifying the structure and the material of the current diffusing layer.

In the description to follow, the light emitting part side of the current diffusing layer is referred to as a lower part of the current diffusing layer and the upper electrode side of the current diffusing layer is referred to as an upper part of the current diffusing layer.

The light emitting element of the present invention comprises a lower electrode on one side of an n-type semiconductor substrate, and, reciting from the substrate side, a light emitting part formed of an InGaAlP material and having a pn junction, a p-type current diffusing layer and an upper electrode, on the other side of said semiconductor substrate. The carrier concentration of said current diffusing layer is lower in the lower part of the current diffusing layer than in the upper part of the current diffusing layer, and at least the upper part of the current diffusing layer is formed of GaP.

DETAILED DESCRIPTION OF THE INVENTION

The present invention is explained in detail in the following by referring to examples.

Figure 1:
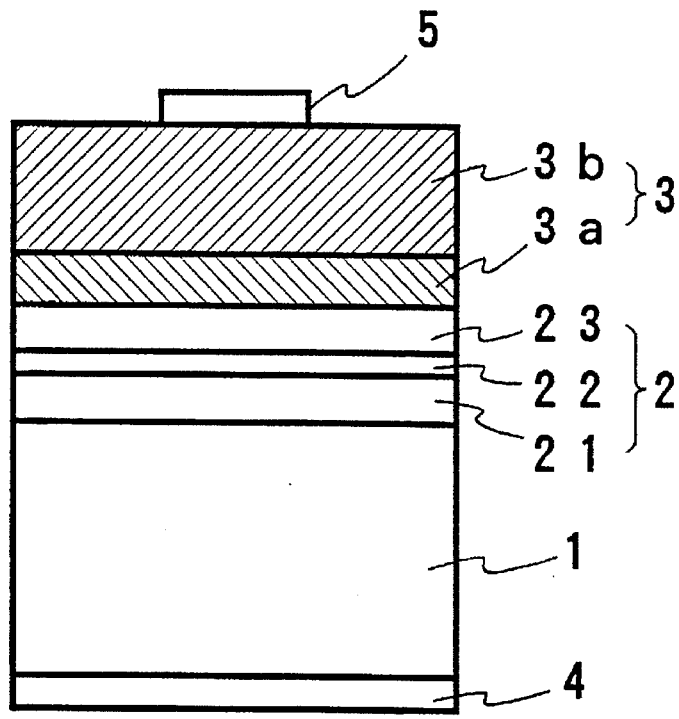
FIG. 1 schematically shows embodiment of the structure of the light emitting element of present invention.

The light emitting element shown in FIG. 1 comprises an n-type GaAs substrate, a light emitting part 2 having a double heterojunction structure formed thereon, and a p-type current diffusing layer 3 further formed thereon. In this example, the current diffusing layer 3 has a two-layer structure of a lower current diffusing layer 3a and an upper current diffusing layer 3b, both being composed of p-type GaP and having different carrier concentrations. The carrier concentration of the lower current diffusing layer 3a is lower than that of the upper current diffusing layer 3b. In this Figure, the lower current diffusing layer 3a and the upper current diffusing layer 3b are hatched for emphasis. The light emitting part 2 is prepared from an InGaAlP material, and an n-type cladding layer 21, an active layer 22 and a p-type cladding layer 23 are successively laminated on the substrate in that order by double heterojunction. A lower electrode 4 is formed under the GaAs substrate 1 and an upper electrode 5 is formed on the uppermost layer.

As mentioned above, the light emitting element of the present invention comprises a current diffusing layer interposed between the light emitting part and the upper electrode. It is critical that the current diffusing layer simultaneously meet the following two requirements.

(1) The carrier concentration of the lower part of the current diffusing layer is lower than that of the upper part of the current diffusing layer.

(2) At least the upper part of the current diffusing layer is composed of GaP.

When the above-mentioned two requirements are met at the same time, particularly superior action of the current diffusing layer which has not existed in prior techniques can be achieved, as explained in the following.

By setting the carrier concentration of the lower part of the diffusing layer as defined in the above (1), the dopant is prohibited from spreading to the light emitting part, even when the carrier concentration of the upper part of the diffusing layer is high. Accordingly, the carrier concentration of the upper part of the diffusing layer can be made sufficiently high to the desired level, and the resistance of the current diffusing layer as a whole inclusive of the lower part thereof can be reduced.

When this is combined with the essential requirement of (2) above, the diffusion-preventing action on the dopant, which is provided by meeting the requirement (1), can be made noticeably superior. The GaP being a compound semiconductor without Al, the amount of the oxygen atom to be taken into the GaP crystals during the epitaxial growth of GaP is sufficiently smaller than in the case of a compound semiconductor comprising Al. This in turn results in scarce inactivation, by oxygen, of the dopant (particularly Zn) to be added, and the same low resistance can be achieved by the addition of the dopant in less amounts than in the case of a compound semiconductor containing Al.

Since the dopant is added in greater Mounts to the upper part of the diffusing layer, the use of GaP for at least the upper part of the diffusing layer can reduce the total amount of the dopant to be added. This in turn leads to a remarkable action of the lower part of the diffusing layer to prevent diffusion of the dopant.

By employing such structure of the current diffusing layer, the luminous efficiency can be improved as compared with conventional ones and the light emitting element comes to have a longer service life and higher reliability.

GaP affords many advantages as a material to be used for the upper part of the diffusing layer in that it passes light of relatively short, yellow to green light wavelength regions well, has superior crystallinity due to its being a binary compound semiconductor, and requires no contact layer since it shows good contacting performance with an upper electrode.

In addition, GaP does not include Al susceptible to oxidation and is superior in resistance to moisture. Consequently, no special anti-oxidation film is needed.

As described in the foregoing, the current diffusing layer comprises a p-type semiconductor capable of transmitting the light from the light emitting part, and at least the upper part of the diffusing layer is formed of GaP. To be specific, a current diffusing layer which is entirely prepared from GaP as shown in FIG. 1 and that having a two-layer structure wherein the upper part of the diffusing layer is composed of GaP and the lower part of the diffusing layer is composed of a different semiconductor crystal are exemplified. When a two-layer structure is employed wherein different materials are used for the two layers, the upper layer is formed of GaP, and the lower layer is preferably prepared from, for example, AlGaAs or InGaAlP. The structure wherein the entire current diffusing layer is formed of GaP is advantageous in that the substitution of material during crystal growth can be omitted and the crystallinity becomes superior. Where the case demands, a structure comprising 3 or more layers of different materials may be employed, in which case the uppermost layer is formed of GaP.

The carrier concentration of the current diffusing layer should be such that the carrier concentration of the lower part of the layer is lower than that of the upper part of the layer. The increase in the carrier concentration may be in a tiered manner from the lower part of the diffusing layer to the upper part thereof or in a continuous manner from the lower part of the diffusing layer to the upper part thereof.

When the carrier concentration varies in a tiered manner, sufficient effects can be obtained by two step changes, which is obtained in the structure shown in FIG. 1. The concentration may be changed in three or more steps, where necessary.

When the carrier concentration changes continuously, the change may be appropriately determined, so that the desired current diffusion and resistance to the diffusion of the dopant can be achieved.

As mentioned earlier, a large amount of the dopant is added to the upper part of the diffusing layer to afford a lower resistance. The preferable carrier concentration of the upper part of the diffusing layer is $8 \times 10^{17}$ cm$^{-3}$–$1 \times 10^{19}$ cm$^{-3}$, particularly preferably $1 \times 10^{18}$ cm$^{-3}$–$5 \times 10^{18}$ cm$^{-3}$.

The degree of diffusion of the current depends on the resistance and thickness of the current diffusing layer. For example, the current can be spread throughout the light emitting part when the carrier concentration is set to $3 \times 10^{18}$ cm$^{-3}$ and the thickness of the current diffusing layer to about 6 µm.

The carrier concentration of the lower part of the diffusing layer should be that which enables inhibiting, by the lower part of the diffusing layer, the dopant of the upper part of the diffusing layer from diffusing to the light emitting part, and which does not cause decrease in voltage. The preferable carrier concentration of the lower part of the diffusing layer is $5 \times 10^{16}$ cm$^{-3}$–$5 \times 10^{17}$ cm$^{-3}$, particularly preferably $1 \times 10^{17}$ cm$^{-3}$–$3 \times 10^{17}$ cm$^{-3}$.

The thickness of the lower part of the diffusing layer may be any as long as it can suppress diffusion of the dopant. For example, when the carrier concentration of the current diffusing layer changes in two steps, the thickness of the lower part of the diffusing layer is 0.1 µm–5 µm, particularly preferably 0.5 µm–2 µm.

The semiconductor substrate may be any as long as it lattice-matches well with the InGaAlP material used for the light emitting part. In the example of FIG. 1, used was GaAs.

It is preferable that a buffer layer having the same composition with the substrate be first formed on the GaAs substrate to improve the quality of the crystals. In the example of FIG. 1, for example, GaAs is formed as a buffer layer having a thickness of about 0.1 µm–1 µm. Note that FIG. 1 does not show a buffer layer.

The GaAs substrate absorbs the light from the light emitting part. Accordingly, a Bragg reflecting layer to reflect the light from the light emitting part may be formed between the GaAs substrate and the light emitting part.

The light emitting part may have a structure of a simple pn junction such as homo junction and heterojunction which comprise two layers, or double heterojunction. Alternatively, it may have a single or multiple quantum well structure.

The material to be used for the light emitting part is exemplified by InGaAlP materials. The InGaAlP material is a compound semiconductor material defined by the aforementioned formula: In$_x$(Ga$_{1-x}$Al$_x$)$_{1-y}$P wherein $0 \leq x \leq 1$ and $0 \leq y \leq 1$, and x and y therein may be determined according to the wavelength of the desired light.

The light emitting part shown in FIG. 1 is one embodiment of a double heterojunction structure and the specific values of x and y are as follows:

cladding layer In$_{0.49}$(Ga$_{0.3}$Al$_{0.7}$)$_{0.51}$P active layer In$_{0.49}$(Ga$_{0.7}$Al$_{0.3}$)$_{0.51}$P The dopant to determine the conductive type of each layer is subject to no particular limitation. Examples thereof are Se and Si for n-type layer, and Zn and Mg for p-type layer. In FIG. 1, Zn was used for p-type layer and Se was used for n-type layer.

As the electrode, those prepared from conventionally known materials and having known structures are usable. In the present invention, the upper part of the diffusing layer is formed from GaP and a contact layer for forming an upper electrode is not required. In FIG. 1, the upper electrode was prepared from AuBe (0.3 μm)/Au (1 μm) and the lower electrode was prepared from AuSn (0.1 μm)/Au (1 μm).

Figure 2:
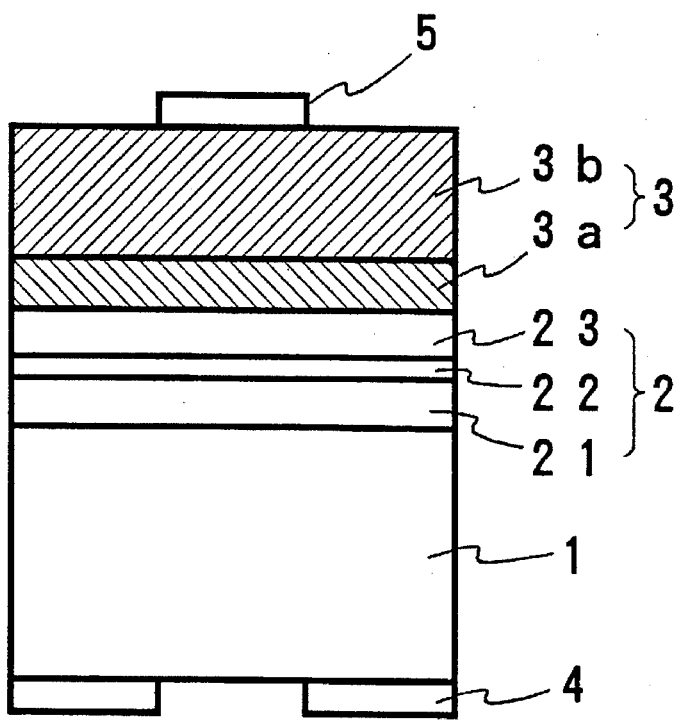
FIG. 2 schematically shows one embodiment of the structure of the electrode of the light emitting element of the present invention.
Figure 3:
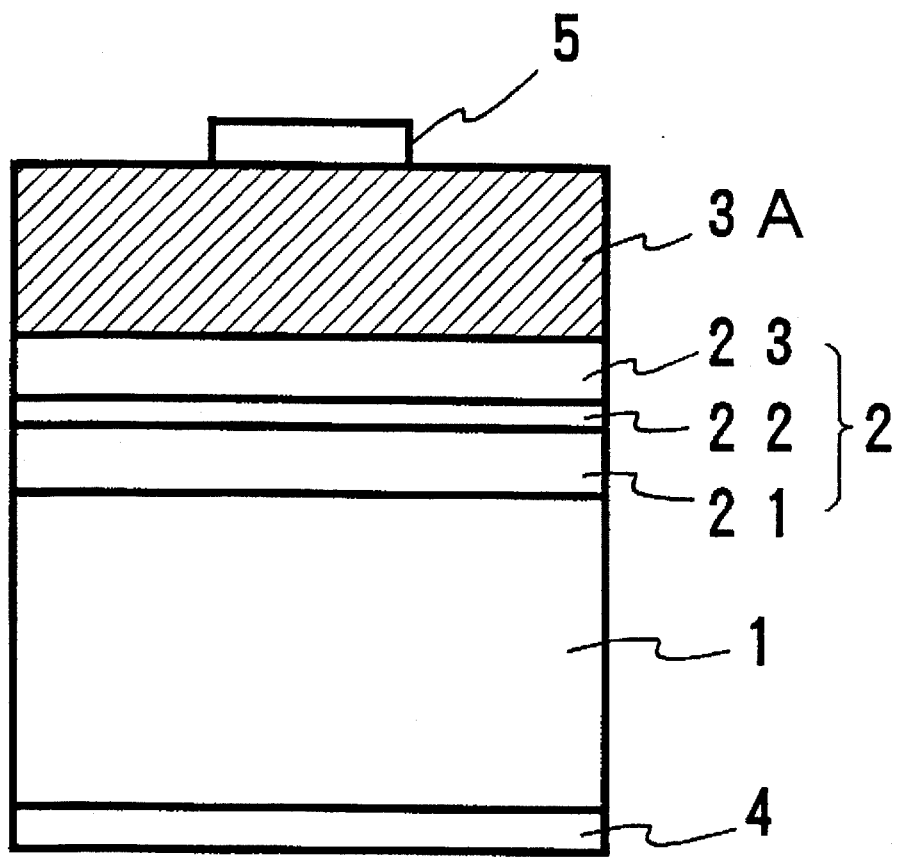
FIG. 3 schematically shows one embodiment of a conventional light emitting element.

The lower electrode was formed under the GaAs substrate in the entirety of the lower surface thereof in FIG. 1. As shown in FIG. 2, however, a lower electrode is preferably not formed in the area which comes right under the upper electrode, since the light from the active layer just under the upper electrode is hindered by the upper electrode. By employing the structure of FIG. 2, the current does not easily flow to the area right under the upper electrode and the light emission from the area of the active layer which corresponds to the upper electrode is suppressed.

The LED shown in FIG. 1 was actually configured and its properties were investigated as in the following.

Experiment 1

In this experiment, the properties of the light emitting element of the present invention and a conventional light emitting element were compared based on the relative brightness. The relative brightness is a ratio of the brightness upon running current for a predetermined time, relative to that at the initial stage of current flow.

As a test sample of the light emitting element of the present invention, the LED shown in FIG. 1 was used. The material, thickness and carrier concentration of respective layers were as follows.

upper part of diffusing layer GaP, 6 μm, $3 \times 10^{18}$ cm$^{-3}$
lower part of diffusing layer GaP, 1 μm, $3 \times 10^{17}$ cm$^{-3}$
p-type cladding layer $In_{0.49}(Ga_{0.3}Al_{0.7})_{0.51}P$, 1 μm, $3 \times 10^{17}$ cm$^{-3}$
active layer $In_{0.49}(Ga_{0.7}Al_{0.3})_{0.51}P$, 0.5 μm, undoped
n-type cladding layer $In_{0.49}(Ga_{0.3}Al_{0.7})_{0.51}P$, 1 μm, $5 \times 10^{17}$ cm$^{-3}$
n-type buffer layer GaAs, 0.5 μm, $4 \times 10^{17}$ cm$^{-3}$
n-type crystal substrate GaAs, 350 μm, $3 \times 10^{18}$ cm$^{-3}$ As the test sample of the conventional light emitting element, an LED prepared in the same manner as in the test sample of the LED of the present invention except that the lower part of the diffusing layer was not included. That is, the current diffusing layer comprised only the layer corresponding to the upper part of the diffusing layer and its thickness was 6 μm.

Figure 4:
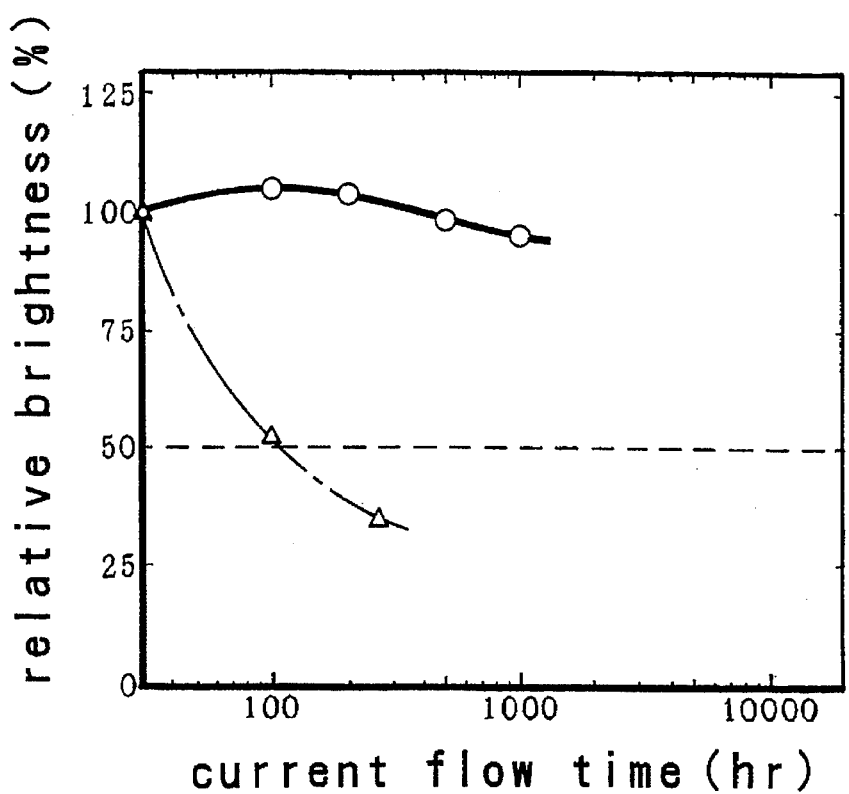
FIG. 4 is a graph showing changes of the relative brightness with time upon flowing current through the light emitting diode (hereinafter LED) of the present invention and a conventional LED.

Current (50 mA) was applied to the LED of the present invention and the conventional LED at 25° C. and changes with time of relative brightness thereof were investigated. The relationship between the current flow time (hr) and relative brightness (%) is shown in FIG. 4. In the graph of FIG. 4, the LED of the present invention is expressed with a thick solid line and the conventional LED is expressed with a dashed line.

As is evident from the graph of FIG. 4, the LED of the present invention showed less decrease in luminous intensity with the course of time, whereas conventional LED showed drastic decrease in luminous intensity. From the results, it has been confirmed that the light emitting element of the present invention has superior service life.

Experiment 2

In this experiment, the light emitting element of the present invention and a conventional light emitting element were subjected to a current flow test under humidity, and relative brightness of each element was compared.

As the test sample of the light emitting element of the present invention, the same one as used in the above experiment 1 was used. As the test sample of the conventional light emitting element, the same LED as the test sample of the present invention was prepared except that AlGaAs was used as the material of the lower part of the diffusing layer and the upper part of the diffusing layer.

Figure 5:
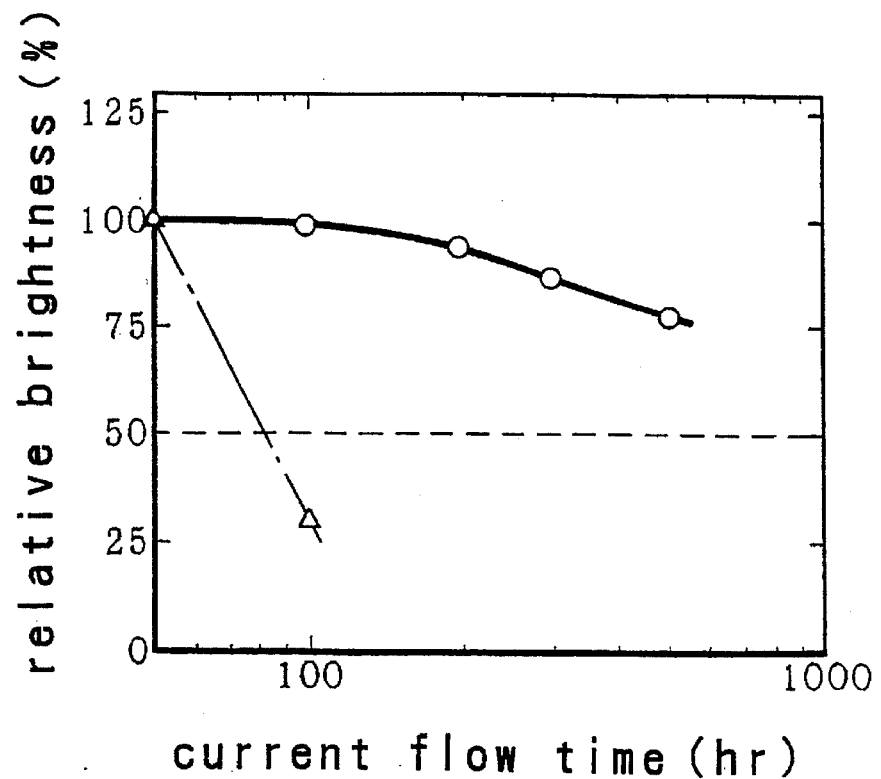
FIG. 5 is a graph showing changes of the relative brightness with time upon flowing current under humidity through the LED of the present invention and a conventional light emitting element.

The light emitting element of the present invention and the conventional light emitting element were subjected to a current flow test under humidity under the conditions of 85° C., 85% and 20 mA, and changes in the relative brightness with time of each element were investigated. The relationship between the current flow time (hr) and relative brightness (%) is shown in FIG. 5. In the graph of FIG. 5, the LED of the present invention is expressed with a thick solid line and the conventional LED is expressed with a dashed line, as in FIG. 4.

As is evident from the graph of FIG. 5, the LED of the present invention showed less decrease in luminous intensity with the course of time, whereas conventional LED showed drastic decrease in luminous intensity. From the results, it has been confirmed that the light emitting element of the present invention has high reliability under the conditions of high humidity and the like, and a superior service life.

As detailedly described in the foregoing, an advantage has been obtained by setting the carrier concentration of the upper part of the current diffusing layer higher than that of the lower part of the current diffusing layer and forming at least the upper part of the current diffusing layer from GaP, that the lower part of the current diffusing layer shows particularly superior suppression of diffusion of the dopant which spreads from the upper part of the current diffusing layer to the light emitting layer, thereby protecting the light emitting layer. As a result, a light emitting element having a long service life, superior reliability and superior luminous efficiency as compared with conventional ones can be obtained.

What is claimed is:

1. A light emitting element comprising an n-type semiconductor substrate, a lower electrode formed on the lower surface of the substrate, and a light emitting element part having a pn junction, which is composed of an InGaAlP compound semiconductor material, a p-type current diffusing layer and an upper electrode layer which are laminated on the upper surface of the substrate in that order from the substrate surface side, wherein a carrier concentration of the current diffusing layer is lower on a light emitting part side thereof than that on an upper electrode side thereof, the upper electrode is in contact with only part of the upper electrode side of the current diffusing layer, and at least the upper electrode side of the current diffusing layer is composed of GaP.

2. The semiconductor light emitting element of claim 1, wherein the carrier concentration of the current diffusing layer changes stepwisely in the direction of the layer thickness.

3. The semiconductor light emitting element of claim 1, wherein the carrier concentration of the current diffusing layer changes continuously in the direction of the layer thickness.

4. The semiconductor light emitting element of claim 1, wherein the carrier concentration of the current diffusing layer on the light emitting part side thereof is $5 \times 10^{16}$ $cm^{-3}$–$5\times10^{17}$ $cm^{-3}$ and that on the upper electrode side thereof is $8\times10^{17}$ $cm^{-3}$–$1\times10^{19}$ $cm^{-3}$.

5. The semiconductor light emitting element of claim 1, wherein the dopant used for determining the carrier concentration of the current diffusing layer is Zn.

6. The semiconductor light emitting element of claim 1, wherein the entire current diffusing layer is composed of GaP.

7. The semiconductor light sitting element of claim 6, wherein the carrier concentration of the current diffusing layer changes stepwisely in the direction of the layer thickness.

8. The semiconductor light emitting element of claim 6, wherein the carrier concentration of the current diffusing layer changes continuously in the direction of the layer thickness.

9. The semiconductor light emitting element of claim 6, wherein the carrier concentration of the current diffusing layer on the light emitting part side thereof is $5\times10^{16}$ $cm^{-3}$–$5\times10^{17}$ $cm^{-3}$ and that on the upper electrode side thereof is $8\times10^{17}$ $cm^{-3}$–$1\times10^{19}$ $cm^{-3}$.

10. The semiconductor light emitting element of claim 6, wherein the dopant used for determining the carrier concentration of the current diffusing layer is Zn.

11. The semiconductor light emitting element of claim 1, wherein the current diffusing layer has two layers of different materials, with the layer on the upper electrode side being composed of GaP and the layer on the light emitting part side being composed of InGaAlP or AlGaAs.

12. The semiconductor light emitting element of claim 11, wherein the carrier concentration of the current diffusing layer changes stepwisely in the direction of the layer thickness.

13. The semiconductor light emitting element of claim 11, wherein the carrier concentration of the current diffusing layer changes continuously in the direction of the layer thickness.

14. The semiconductor light emitting element of claim 11, wherein the carrier concentration of the current diffusing layer on the light emitting part side thereof is $5\times10^{16}$ $cm^{-3}$–$5\times10^{17}$ $cm^{-3}$ and that on the upper electrode side thereof is $8\times10^{17}$ $cm^{-3}$–$1\times10^{19}$ $cm^{-3}$.

15. The semiconductor light emitting element of claim 11, wherein the dopant used for determining the carrier concentration of the current diffusing layer is Zn.

16. The semiconductor light emitting element of claim 1, wherein the semiconductor substrate is a GaAs substrate and the light emitting part has a double heterojunction structure comprising an n-type cladding layer, an active layer and a p-type cladding layer laminated on the substrate in that order from the substrate side.

* * * * *